(12) United States Patent
Champanis et al.

(10) Patent No.: US 11,252,836 B2
(45) Date of Patent: Feb. 15, 2022

(54) COMMUNICATION NETWORK PERFORMANCE MONITORING AND POWER BACKUP

(71) Applicant: HEWLETT PACKARD ENTERPRISE DEVELOPMENT LP, Houston, TX (US)

(72) Inventors: Michael Champanis, Cape Town (ZA); Ross Douglas, Cape Town (ZA); David Wilson, San Francisco, CA (US); Fouad Zreik, San Francisco, CA (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 55 days.

(21) Appl. No.: 16/176,183

(22) Filed: Oct. 31, 2018

(65) Prior Publication Data

US 2019/0258304 A1 Aug. 22, 2019

Related U.S. Application Data

(60) Provisional application No. 62/633,860, filed on Feb. 22, 2018.

(51) Int. Cl.
| | |
|---|---|
| *G06F 1/00* | (2006.01) |
| *G06F 11/30* | (2006.01) |
| *H05K 7/14* | (2006.01) |
| *H04L 43/0888* | (2022.01) |
| *G01D 11/30* | (2006.01) |
| *F16M 13/02* | (2006.01) |
| *G06F 1/28* | (2006.01) |
| *G06F 1/30* | (2006.01) |

(52) U.S. Cl.
CPC ............... *H05K 7/14* (2013.01); *F16M 13/02* (2013.01); *G01D 11/30* (2013.01); *G06F 1/28* (2013.01); *G06F 1/305* (2013.01); *H04L 43/0888* (2013.01)

(58) Field of Classification Search
CPC ....................................................... H05K 7/14
See application file for complete search history.

(56) References Cited

U.S. PATENT DOCUMENTS

| | | | |
|---|---|---|---|
| 8,955,344 B2 | 2/2015 | Kostelecky et al. | |
| 2008/0082849 A1* | 4/2008 | Takahashi | G06F 11/326 713/340 |
| 2010/0127569 A1* | 5/2010 | Dai | H02J 9/061 307/64 |
| 2011/0157805 A1 | 6/2011 | Mi et al. | |
| 2011/0277569 A1 | 11/2011 | Rush | |
| 2012/0297228 A1* | 11/2012 | Graves | G06F 1/28 713/340 |
| 2014/0355182 A1 | 12/2014 | Wang | |

(Continued)

*Primary Examiner* — Mohammed H Rehman

(57) ABSTRACT

A power backup method for use in a communication network monitoring device and a communication network monitoring device are provided. The method includes detecting an external power failure to a communication network monitoring device; switching to a backup power source internal to the communication network monitoring device upon detecting the external power failure: and while powered by the backup power source: generating an issue report recording the detected external power failure; communicating the issue report; shutting down operation of the communication network monitoring device after communicating the issue report.

19 Claims, 6 Drawing Sheets

(56) References Cited

U.S. PATENT DOCUMENTS

2015/0091475 A1\* 4/2015 Lieu ..................... H02P 3/18
                                                          318/3
2016/0231014 A1\* 8/2016 Ro ....................... F24F 11/62
2016/0357994 A1\* 12/2016 Kanakarajan ..... H04W 12/1206

\* cited by examiner

COMMUNICATION NETWORK PERFORMANCE MONITORING AND POWER BACKUP

CROSS-REFERENCE TO RELATED APPLICATIONS

Priority to the earlier effective filing date of U.S. Provisional application Ser. No. 62/633,860, filed Feb. 22, 2018, in the name of the inventors Michael Champanis, et al., under 35 U.S.C. § 109 (e) is hereby claimed. This related application is hereby incorporated for all purposes as if expressly set forth verbatim herein.

FIELD OF THE DISCLOSURE

This disclosure relates to systems, methods and devices which may find application in the gathering, analyzing and reporting of communication network performance data. Other applications may also be envisaged.

BACKGROUND TO THE DISCLOSURE

As communication network reliability and performance is becoming more critical to the day to day operations of businesses and individuals, and as these networks grow in complexity, the ability to assess the performance of the various networks used is becoming critical. The monitoring and upkeep of large networks can also be a challenge. Getting reliable information about the network at fixed points becomes a valuable tool in diagnosing networking issues. Wireless networking is specifically susceptible to environmental conditions on site.

It is desirable that the network performance be communicated back to the network administrator even in the event that the network, itself is not functioning, or power on the site has been lost.

The preceding discussion of the background to the disclosure is intended only to facilitate an understanding of the present disclosure. It should be appreciated that the discussion is not an acknowledgment or admission that any of the material referred to was part of the common general knowledge in the art as at the priority date of the application.

BRIEF DESCRIPTION OF THE DRAWINGS

Aspects of the disclosure will now be described, by way of example only, with reference to the accompanying drawings. In the drawings.

While the invention is susceptible to various modifications and alternative forms, the drawings illustrate specific embodiments herein described in detail by way of example. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION WITH REFERENCE TO THE DRAWINGS

Illustrative embodiments of the subject matter claimed below will now be disclosed. In the interest of clarity, not all features of an actual implementation are described in this specification. It will be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort, even if complex and time-consuming, would be a routine undertaking for those of ordinary skill in the art having the benefit of this disclosure.

Aspects of the disclosure may provide a communication network monitoring device. The device may be configured to monitor the performance of various types of communication networks, such as local area networks, wide area networks, wireless communication networks and the like. The device may include various communication network interfaces which interface with the various communication networks which the device is configured to monitor. The device may include various hardware and software components which are configured to monitor various parameters associated with each of the communication network interfaces. The device may further be configured to store and/or report data relating to the monitoring parameters.

Figure 1:
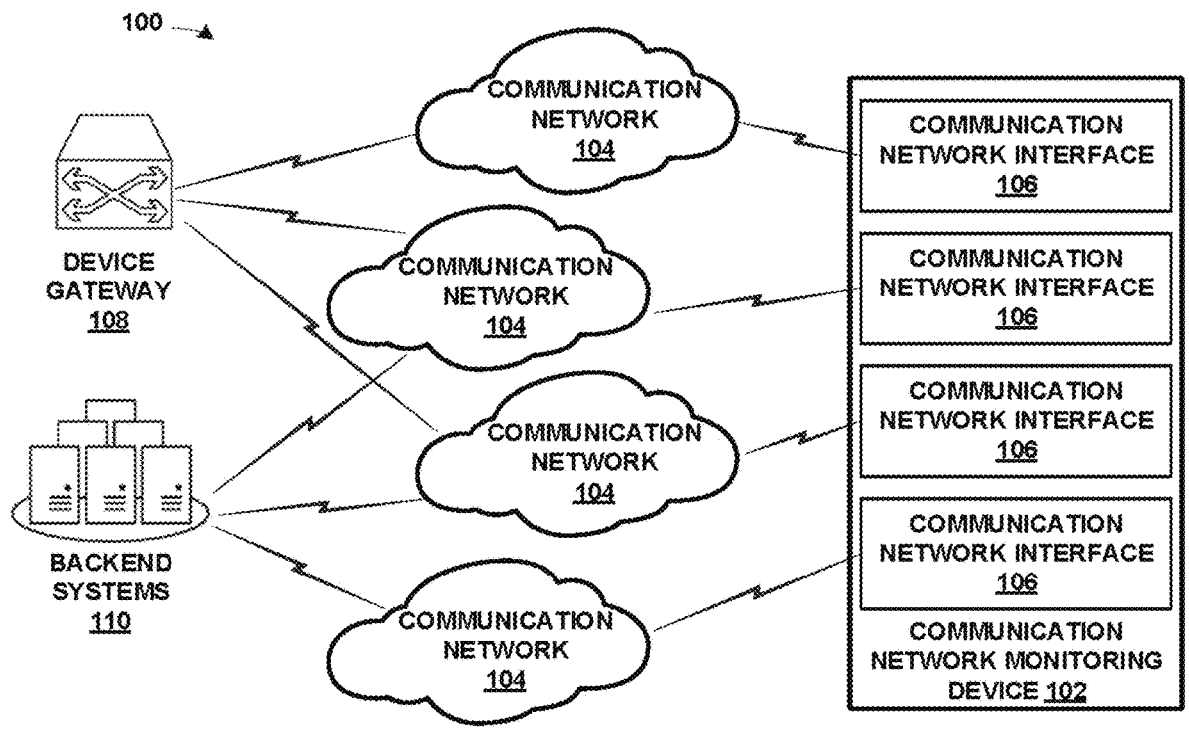
FIG. 1 is a schematic diagram which illustrates an example communication network monitoring system.

FIG. 1 is, a schematic diagram which illustrates an example communication network monitoring system (100). The communication network monitoring system (100) includes a communication network monitoring device (102) which interfaces with a plurality of communication networks (104) via appropriate communication network interfaces (106). The system may further include a device gateway (108). The device gateway (108) may be responsible for delivering communication from the communication network monitoring device (102) to backend systems (110), such as a data archival service, a notification service and the like. It should be appreciated that although only one device is illustrated, there may be a plurality of each of these.

Each of the communication networks (104) may be different. The differences may be any one of the seven layers of the OSI model of computer networking. For example differences between each of the communication networks may be in one or more of the physical layer, transport layer, network layer, application layer, and the like. Example communication networks which are monitored include Ethernet, WI-FI™, cellular and the like.

Figure 2:
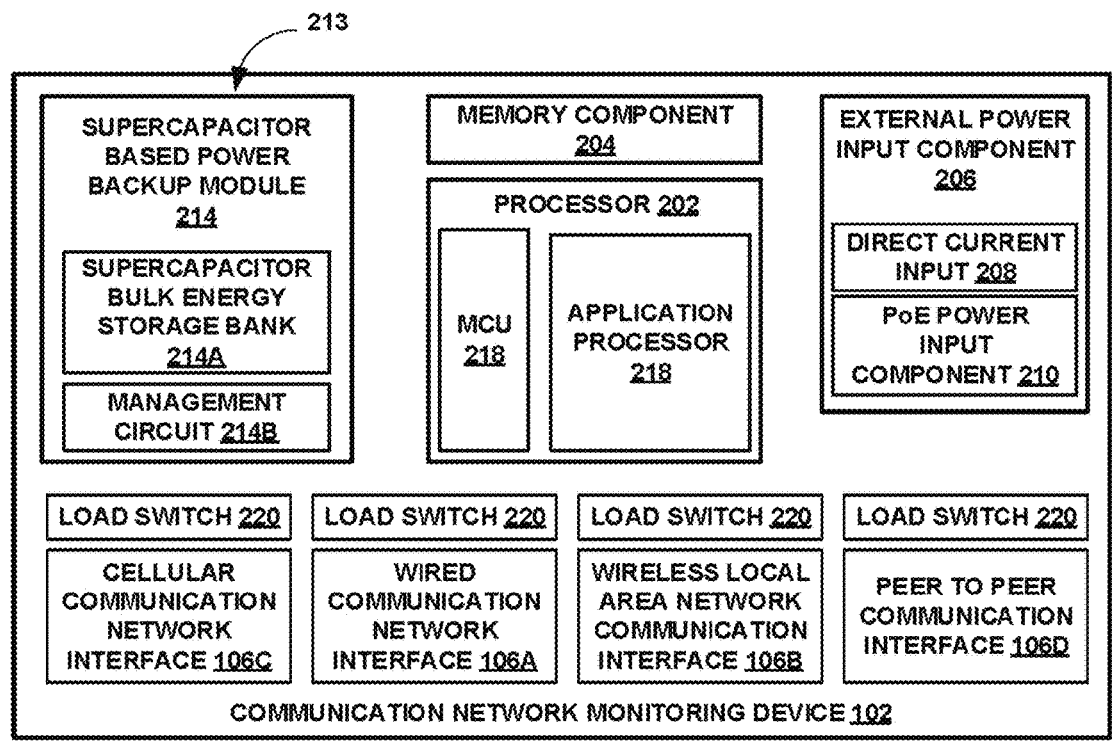
FIG. 2 is a block diagram which illustrates example components which may be provided by a device used in a monitoring system.

The communication network monitoring device (102) may include various components for implementing the functionality described herein. FIG. 2 is a block diagram which illustrates example components which may be provided by the communication network monitoring device (102).

The communication network monitoring device (102) may include a processor (202) for executing the functions of firmware and/or software units described herein. The communication network monitoring device (102) may include a memory component (204) in which various firmware and/or software units and associated instructions may be stored and from which instructions may be provided to the processor (202) to carry out the described functionality.

The communication network monitoring device (102) may include an external power input component (206) arranged to receive electrical power from one or more external power sources (not shown). The external power input component (206) may include a direct current input (208) and a power-over-Ethernet (PoE) power input component (210).

The direct current input (208) may receive a direct current power input via an external DC power supply source operating at a voltage between 9 Volts and 26 Volts. The direct current input (208) may be configured to supply about 15 Watts of power to the communication network monitoring device (102). A 12 Volts at up to 1 Ampere (12V/1 A) mains powered external DC power supply may be used.

The PoE power input component (210) may be configured according to the 802.3af standard and may be configured to provide up to 15.4 Watts of electrical power to the communication network monitoring device (102). The PoE power input component (210) may interface with a standard registered jack (RJ) 45 connector which in turn receives electrical power via a standard twisted pair Cat 5 cabling. The PoE power input component (210) may include a PoE-to-DC converter which converts the electrical power provided via the connecter to provide a 12 Volt direct current (DC) output.

The external power input component (206) may further be configured to interface with alternative power sources (not shown). The external power input component (206) may, for example, be arranged to receive electrical power from a high capacity battery (not shown), which may be charged using renewable energy in the form of solar power through the use of solar panels and the like.

The communication network monitoring device (102) may include a power backup component (213) arranged to provide electrical power in cases where the external power sources fail. The power backup component (213) may include a supercapacitor-based power backup module (214). The supercapacitor-based power backup module (214) may provide a supercapacitor bulk energy storage bank (214A) and an integrated supercapacitor management circuit (214B). The integrated supercapacitor management circuit (214B) is responsible for various tasks. For example, the integrated supercapacitor management circuit (214B) may be configured to charge the supercapacitors (not shown) at a constant rate by dropping input voltage using a built-in voltage regulator. The integrated supercapacitor management circuit (214B) may be configured to monitor the health of the supercapacitors and constantly balance them. The integrated supercapacitor management circuit (214B) may be configured to protect from over voltage on the external power input. The integrated supercapacitor management circuit (214B) may be configured to measure, store and make available readings of the system such as voltages, currents, errors, and limits, over a communication interface (e.g., I2C, SPI, etc.). The integrated supercapacitor management circuit (214B) may be configured to detect a drop in input voltage of the external power input component (206) and seamlessly enable the power backup component (213) and use the supercapacitor bulk energy storage bank (214A) to provide stored energy. The integrated supercapacitor management circuit (214B) may be configured to boost the voltage from the supercapacitor bulk energy storage bank (214A) when the voltage decreases below the minimum programmed backup voltage. The integrated supercapacitor management circuit (214B) may be configured to switch off the output when the voltage reaches a critical value, (e.g., once the supercapacitor bulk energy storage bank (214A) has been completely discharged).

The power backup component (213) (in particular the supercapacitors) is kept in a fully charged state. In the event of a loss of external power to the device, the integrated supercapacitor management circuit (214B) may detect the drop in input power and may instantaneously switch over to the supercapacitor bulk, energy storage bank (214A) to provide power to the communication network monitoring device (102). The supercapacitor bulk energy storage bank (214A) may then be responsible for providing power to the communication network monitoring device (102). When the supercapacitor bulk energy storage bank (214A) voltage drops to a programmed lower limit for the power backup to output, for example 5 Volts, the integrated supercapacitor management circuit (214B) may enable a DC-to-DC boost circuit that converts the supercapacitor bulk energy storage bank (214A) voltage to the required level to maintain a constant output voltage. As the supercapacitors continue to discharge, a point may be reached where they are almost depleted, and the integrated supercapacitor management, circuit (214B) turns off the output. The power, backup is then completely depleted and the communication network monitoring device (102) will be in the OFF state.

The power backup component (213) may include alternative power backup solutions. One example is the use of a small battery (not shown) that is able to store enough energy to ensure the required backup time is achieved in the event of an external input power failure. This may entail additional requirements in order to ensure the battery is charged correctly and safely, as well as ensuring that the battery is not discharged too much so as to put it in an unsafe state or damage it in any way.

The processor (202) may include one or both of a microcontroller unit (MCU) (216) and an application processor (218). The MCU (216) for example to an 8-bit, 16-bit, 32-bit, etc., microcontroller which may be powered while electrical power is available to the device (including in the power backup state). The MCU (216) may be configured to execute custom firmware that enables the MCU (216) to be responsible for a number of separate tasks, some of which are mentioned below. The MCU (216) may be configured to perform multiple tasks seemingly simultaneously by using timers and interrupts. For practical purposes it can be assumed that the tasks run continuously. The MCU (216) may utilize an, external tuned crystal oscillator (not shown) to ensure accurate timing throughout different operating temperatures.

The MCU (216) may have General Purpose Input-Output (GPIO) pins (not separately shown) that can be used to connect the MCU (216) to other systems in an electronics design. These GPIO pins can be used as inputs, where external components drive them, or they can be used as outputs where the MCU (216) drives them.

The MCU (216) may be configured to control power to various components of the communication network monitoring device (102). The MCU (216) may interface with and control load switches (220) which may, for example, control the application, processor (218), wireless subsystems and the like. Through the load switches (220) the MCU (216)

may be able to turn these components on and off at particular times, on particular events and the like. The MCU (216) may be in communication with the application processor (218) (e.g., via a serial interface not shown) via which the application processor (218) may be able to send commands to the MCU (216). This means the application, processor (218) can indirectly control power to the wireless components, and even itself.

The MCU (216) may be directly connected to the integrated supercapacitor management circuit (214B), e.g., by means of an i2c interface and/or through GPIO pins. One of these pins may be a power fail indicator (PH) pin (not shown) on the integrated supercapacitor management circuit (214B). This pin may be connected to an interrupt on the MCU (216). In the event that a power failure occurs, the integrated supercapacitor management circuit (214B) immediately detects this as it constantly monitors the external power input component (206). This leads to the PFI pin of the integrated supercapacitor management circuit (214B) driving the interrupt of the MCU (216) which may in turn cause the MCU (216) firmware to recognize the external power failure. The MCU (216) may then enter a power failed state, and may be configured to notify the application processor (218) of this state.

The MCU (216) may notify the application processor (218) of the external power failure using a GPIO line, similar to how the MCU (216) is alerted by the integrated supercapacitor management circuit (214B). The application processor (218) may have a service that continuously checks the state of the GPIO line between it and the MCU (216). If this line is driven high by the MCU (216), then the application processor (218) may be configured to identify that an external power failure has occurred, and can act accordingly. By using a GPIO line instead of the serial interface, the notification can be signaled to the application processor (218) immediately and asynchronously, and does not rely on any message sending/checking mechanisms, although other communication mechanisms may be viable.

The MCU (216) may include an accurate 16-bit timer to control and monitor functions with high timing resolution. The MCU (216) may implement an intelligent watchdog timer for the entire device. If the application processor (218) stops interacting with the MCU (216) for a specific amount of time, the MCU (216) will reset the entire device.

The MCU (216) may be configured to control a Red Green and Blue (RGB) tri-color LED (not shown) that is used to indicate the status of the device to users in the vicinity of the device. Example statuses and colors include: purple: powered on; blue: booting; white flashing: software starting; white: software started; green flashing: waiting for configuration; green: testing your network; yellow: power outage; orange: no connectivity; and red: device issues.

The memory component (204) may include a built-in electrically erasable programmable read-only memory (EEPROM) which may be provided by the MCU (216). The EEPROM may be configured to store information for the communication network monitoring device (102). This can include information that is unique to the communication, network monitoring device (102), such as a device serial number and the like.

The MCU (216) may be configured to monitor device parameters by interrogating, for example, the integrated supercapacitor management circuit (214B), checking external input power voltage levels and making use of temperature sensors. This information is continuously updated as long as the MCU (216) is running, and the information is accessible from the application processor (218).

The application processor (218) may include any suitable processing circuitry to provide the functions described herein. In one example implementation, the application processor (218) may be provided by a dual core ARM Cortex A9 (operating at 1.6 GHz), although any suitable alternative may be used. The application processor (218) may be in, the form of a central processing unit (not separately shown) and may execute a suitable operating system for controlling its operation (such as a full stack version of Linux and, the like). The application processor (218) may include on-board memory and communications interfaces and may include multiple processing cores (all of which are also not separately shown). Electrical power to the application processor (218) may be controlled by the MCU (216). The communication network monitoring device (102) may be configured to first boot the MCU (216) which in turn boots the application processor (218) which loads the operating system and executes functionality described herein.

As mentioned above, the communication network monitoring device (102) may include a plurality of load switches (220) configured to provide electrical power to, for example, the application processor (218) and various communication network interfaces. Operation of the load switches (220) may be controlled by the MCU (216) which, as mentioned, is powered even in power backup mode. This means that on power-on, the MCU (216) may be responsible for turning on various components of the communication network monitoring device (102). Once the application processor (218) has booted, it may take over and control the communication network monitoring device (102) and its respective components, in some cases via the MCU (216) (e.g., by issuing commands to the MCU (216)). By providing individual load switches (220) to various components, the application processor (218) and MCU (216) may be able to control the power backup usage by turning certain systems off if desired. As mentioned, the application processor (218) even has the ability to turn its own power off.

The communication network monitoring device (102) may include a plurality of input components, for example in the form of push-buttons (not shown), via which users may interact with the device. The push buttons may be mechanical push buttons and may be connected to the MCU (216), The MCU (216) may provide a push button state indication (also not shown) to the application processor (218).

As mentioned, the communication network monitoring device (102) may include a plurality of communication network interfaces (106). Each of the communication network interfaces (106) may be configured to connect to the Internet through their respective network technologies. Each communication network interface (106) may operate as an, independent component and may have its own power control load switch.

One example communication network interface (106) is a wired communication network interface (106A) arranged to communicate on a wired communication network. The communication network monitoring device (102) may include one or more wired communication network interfaces (106A), such as an Ethernet interface. The Ethernet interface may be configured to interface with a Megabit, Gigabit (or 1000BASE-T), 10 Gigabit Ethernet-enabled communication network and the like. If the wired communication network allows Internet connectivity, then the communication network monitoring device (102) may connect to the Internet via the wired communication network interface (106A).

The communication network monitoring device (102) may for example include a wireless local area network communication interface (106B). The wireless local area network communication interface (106B) may be configured for communication on, for example, an IEEE 802.11 wireless communication network. The wireless local area network communication interface (106B) may allow for connectivity via wireless local area networks such as WI-FI™. The communication network monitoring device (102) may be configured to connect to a suitable wireless network and access the Internet via the wireless local area network communication interface (106B).

The communication network monitoring device (102) may include suitable antennas (not shown) via which the wireless local area network communication interface (106B) may interface with the communication network. The antennas may be dedicated on-board antennas for use by the wireless local area network communication interface (106B). This allows the wireless local area network communication interface (106B) to make full use of antenna diversity as well as multiple-input, multiple-output (MIMO) and spatial streams technology.

The communication network monitoring device (102) may further include a cellular communication network interface (106C). The cellular communication network interface (106C) may be configured for communication on one or more cellular communication networks. Exemplary cellular communication networks include GSM-, EDGE-, UMTS- and HSPA-based networks. The cellular communication network interface (106C) may include a dedicated cellular modem. The communication network monitoring device (102) may be able to connect to a suitable cellular communication network and access the Internet via the cellular communication network interface (106C). The communication network monitoring device (102) may include a dedicated on-board antenna (not shown) for use by the cellular communication network interface (106C).

The communication network monitoring device (102) may further include a peer to peer communication network interface (106D).

Figure 3:
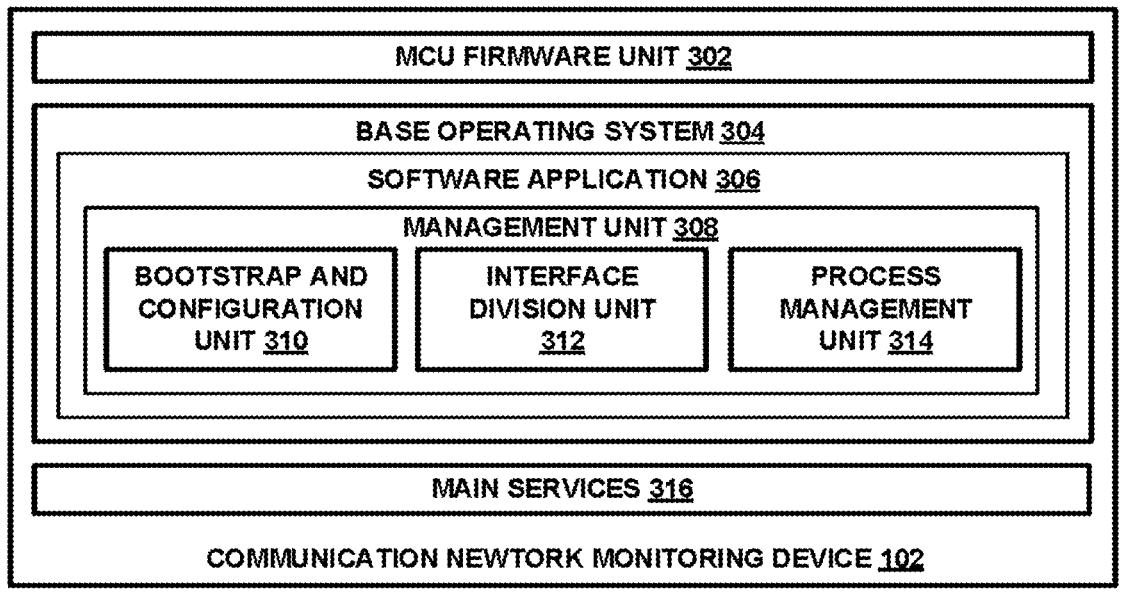
FIG. 3 is a block diagram which illustrates an example grouping of firmware and software units described herein.

As mentioned, the communication network monitoring device (102) may execute instructions provided by various software and/or firmware units in order to provide functionality described herein. FIG. 3 is a block diagram which illustrates an example grouping of firmware and software units which may, for example, be stored in the memory component (204) of the communication network monitoring device (102) shown in FIG. 2. In some cases, for example in a cloud computing implementation, software units arranged to manage and/or process data on behalf of the communication network monitoring device (102) may be provided remotely. Some of the software units may be provided by a software application which is executable on the communication network monitoring device (102).

The communication network monitoring device (102) may include an MCU firmware unit (302). The MCU firmware unit (302) may be configured to perform a variety of tasks with respect to controlling and monitoring the state of the communication network monitoring device (102) and its subsystems. The MCU firmware unit (302) may be responsible for powering on the various components of the communication network monitoring device (102) when external power is applied to the communication network monitoring device (102). The MCU firmware unit (302) may be configured to monitor the communication network monitoring device (102) through an array of sensors, and may also be configured to launch the interrupt service that will detect a possible power failure (as discussed above). The MCU firmware unit (302) may be configured to receive instructions from the application processor (218) (once it has booted successfully) shown in FIG. 2 by way of which the application processor (218) controls the communication network monitoring device (102) by issuing commands to the MCU firmware. Once the application processor (218) has booted, the MCU firmware unit's main responsibility is then to continue monitoring the state of the communication network monitoring device (102) (in particular monitoring for a possible external power failure).

The MCU firmware unit (302) may be configured to monitor its own operation. A built-in watchdog timer may be configured to reset the MCU (216) in the event that the firmware stops running. This resets the MCU (216), which will reset the entire communication network monitoring device (102) by virtue of the load switches (220) to the various components.

The communication network monitoring device (102) may include a base operating system (304). The base operating system (304) may for example be based on full-stack Linux distribution or other viable alternative. The base operating system (304) may include software that manages various components of the communication network monitoring device (102) and may provide common services for software applications executing on the communication network monitoring device (102). The application processor (218), shown in FIG. 2, may thus be able to execute a variety of different software applications and may make use of general software mechanisms such as threading and the like.

The communication network monitoring device (102) may include a software application (306) as shown in FIG. 3. The software application (306) may be configured to monitor the various communication networks (104) shown in FIG. 1 with which the communication network monitoring device (102) interfaces. This may include testing the various networks via the communication network interfaces. The software application may be stored in memory and may be unpacked and installed by a loader process.

This process may launch a management unit (308). The management unit (308) may be configured to bootstrap and configure the communication network monitoring device (102), bring up and manage all processes that are involved in gathering network metrics, as well as resetting the intelligent watchdog timer described above.

The management unit (308) may include a bootstrap and configuration unit (310). The bootstrap and configuration unit (310) may be configured to, on boot, configures the communication network monitoring device (102) MAC addresses, hostname, and other device-unique information that is stored in the EEPROM of the memory component (204) shown in FIG. 2. This information may assist in uniquely identify the communication network monitoring device (102).

The management unit (308) may include an interface division unit (312) which may be configured to separate each communication network interface (106) into its own network namespace. This may be desired in order to obtain accurate network metrics. For example, the Ethernet interface may be moved into the Ethernet namespace, the WI-FI™ interface may be moved into the WI-FI™ namespace, and the cellular interface may be moved to the cellular namespace. The effect of this may be to provide each namespace with its own separate network stack.

The management unit (308) may include a process management unit (314) which may be configured to manage main services (316) associated with the device software. Exemplary services include testrunner, a system control service, an interface control service, a power outage handler service, and a packet capture and analysis service, none of which are separately shown.

The system control service may be responsible for interfacing with the MCU (216). Example operations would include reading from the EEPROM of the memory component (204) shown in FIG. 2 and resetting in the intelligent watchdog timer.

An interface control service may be executed for each namespace (e.g., Ethernet, WI-FI™, Cellular). This service may be run inside the namespace, and from its point of view all network operations may be independent of other namespaces. The interface control services may run an HTTP REST API RPC server using Unix sockets. Other services such as testrunner and the power outage handler can request network operations by sending an HTTP request to these Unix sockets.

The testrunner service may be configured to perform orchestration of the testing process and may be arranged to run network tests, update the software, detect issues, upload all recorded metrics and issues and the like.

The power outage handler service may be configured to handle an external power outage. This may include instructing the testrunner service to stop, generating an issue report in the desired format, using each interface simultaneously to send this issue to the device gateway (108), and finally shutting down the application processor (218): The power outage handler service may be configured to operate with the limited power backup time available.

The power outage handler service may include a power interrupt service. The power interrupt service may be configured to run continuously. The power interrupt service may be configured to run separately from the main device software. For example, the power interrupt service may be configured to use code written in a specific programming language (e.g., "C") and may be configured to poll the application processor (218)'s power interrupt GPIO pin. The power interrupt service may accordingly be configured to detect, via the GPIO pin that an external power source failure has occurred. The power interrupt service may be configured to notify the power outage handler service by sending a suitable signal (e.g., a Unix signal) to this service.

Once the power outage handler service is notified of an external power source failure, it may be configured to perform one or more of the following. The power outage handler service may be configured to notify other services, of the power outage. For example, the main software loop may be instructed to stop testing (e.g., by using a Unix signal). The power outage handler service may be configured to generate an issue. An issue may be generated and persisted in the local storage database of the communication network monitoring device (102), to enable the communication network monitoring device (102) to later determine when it last lost power. The power outage handler service may be configured to upload the issue to the device gateway (108). For example, after an issue has been generated, the power outage handler service may be configured to create a processing thread for each of the communication network interfaces (e.g., the Ethernet, WI-FI™, Cellular interfaces). These threads may be configured to communicate with each interface's respective interface control process. Each thread may be configured to attempt to connect its respective interface to the internet if it is not already connected. Once connected to the internet and the device gateway cloud service is accessible, each thread may be configured to attempt to upload the issue to the device gateway cloud service. The power outage handler service may be configured to shut down the application processor (218). For example, as soon as the issue is able to be uploaded via a communication network interface or if a specific amount of time has passed, the power outage handler service may be configured to shut down the application processor (218). This specific time may be the maximum amount of time that the power backup system is able to keep all systems running, plus the amount of time it takes to shut down the application processor (218).

Figure 4:
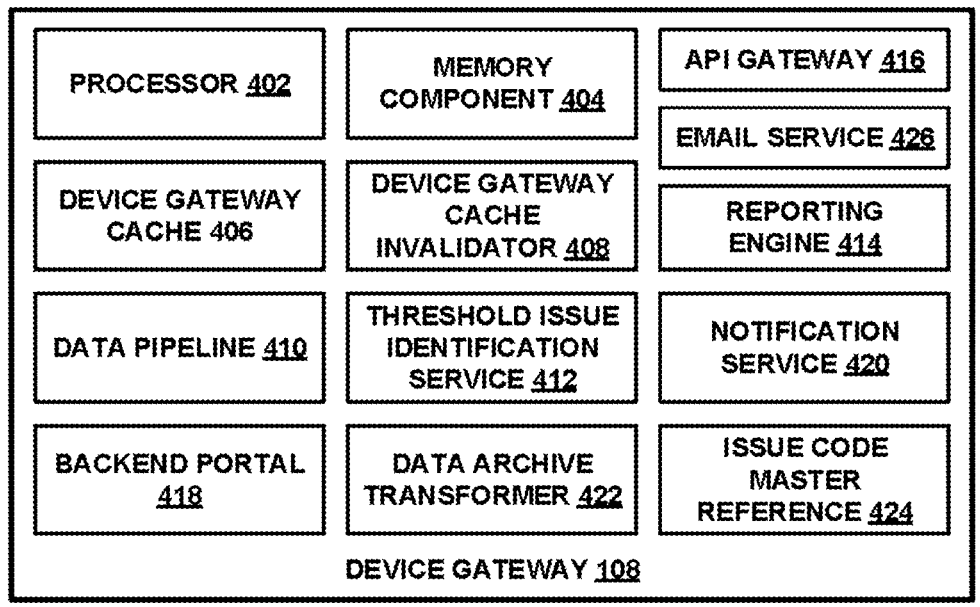
FIG. 4 is a block diagram which illustrates example components which may be provided by the device gateway.

FIG. 4 is a block diagram which illustrates example components which may be provided by the device gateway (108). The device gateway (108) may provide a device gateway cloud service.

The device gateway (108) may include a processor (402) for executing the functions of components described below, which may be provided by hardware or by software units executing on the device gateway (108). The software units may be stored in a memory component (404) and instructions may be provided to the processor (402) to carry out the functionality of the described components. In some cases, for example in a cloud computing implementation, software units arranged to manage and/or process data on behalf of the device gateway (108) may be provided remotely.

As shown in FIG. 1, the device gateway (108) may be configured to communicate with the communication network monitoring device (102) via one or more of the communication networks (104). The device gateway (108) may further be configured to communicate with the backend system (110) via a suitable communication network.

The device gateway (108) may be configured to authenticate the communication network monitoring device (102). This may be done initially and may be to ensure that communication is with the correct communication network monitoring device (102). Once the communication network monitoring device (102) has been successfully authenticated, communication with the communication network monitoring device (102) may be passed on to a data pipeline (410), shown in FIG. 4, for consumption by other services. Messages that fail to be put on the data pipeline (410) are communicated back to the communication network monitoring device (102) and may be re-uploaded at a later stage.

Still referring to FIG. 4, the device gateway (108) may include a device gateway cache (406), which may be a separate service to the device gateway (108) and which may serve as an in-memory cache of resources which are frequently requested by the device gateway (108) from other backend systems (110), shown in FIG. 1, such as the backend portal or another database. The device gateway (108) may be configured to check the device gateway cache (406) initially before requesting the resources from their sources. If the resources are present in the device gateway cache (406), they may be returned from the device gateway cache (406), whereas if they are not present, they may be fetched from their source and added to the device gateway cache (406).

The device gateway (108) may include a device gateway cache invalidator (408). The device gateway cache invalidator (408) may be an ancillary service that ensures data in the device gateway cache (406) are up-to-date. The service may be configured to monitor multiple services for changes. When a change is detected that affects data in the device gateway cache (406), the device gateway cache invalidator (408) may remove the relevant information from the device gateway cache (406).

The device gateway (108) may include or have access to a data pipeline (410). The data pipeline (410) may include a cloud-based real-time data streaming service. The data pipeline (410) may be configured to provide multiple systems to process messages independently of one another, while handling retention of messages should a system fail. The data pipeline (410) may also be configured to manage scalability of the workers (not shown) that process the messages. Should more workers be desired in order to process results in a timeous manner, the data pipeline (410) can direct consumers to launch more workers. This allows for high message throughput rates to be achieved with messages being split across each worker.

The device gateway (108) may include a threshold issue identification service (412). A threshold issue may be generated when a monitored metric is out of the range of valid, user-defined, values for a user-defined period of time. A smoothing algorithm is used to reduce false positives. Identified issues may be synchronized to the notification service.

The device gateway (108) may include a reporting engine (414), which may be configured to collate information while the communication network monitoring device (102) is online. Power outage messages are mapped onto a timeline to determine when devices are online. This enables network summaries to be created for periods while devices are online.

The device gateway (108) may include an API gateway (416), which may provide a secure point of access the dashboards and the like. Each access via the API gateway (416) may be authenticated.

Dashboards accessing the system via the API gateway (416) may be configured to query for any power outage messages from the communication network monitoring device (102) (or devices). The relevant backend service is contacted from the gateway and a list of the issues is returned to the dashboard.

Still referring to FIG. 4, the device gateway (108) may include a backend portal (418). The backend portal may facilitate information exchange between the device gateway (108) shown in FIG. 1 and the backend services. The backend portal (418) may store information necessary for each communication network monitoring device (102). For example, credentials may be stored in order to authenticate messages, including power outage messages, from the communication network monitoring devices (102).

The device gateway (108) may include a notification service (420). The notification service (420) may be configured to collect all issues, including power outage issues, detected by each communication network monitoring device (102) into a single location. This notification service (420) also tracks the state of each issue and presents the most up-to-date view to users. These issues may be queried by the dashboard via the API gateway (416). This notification service (420) may be configured to send updates to a real-time messaging service (not shown) for real-time updates on the dashboard. The notification service (420) may also be responsible for communicating issues via email, or other third party integrations.

The device gateway (108) may include a data archive transformer (422) which may be configured to transform and store issues (e.g., power outage issues) and test results in a data archive store for long-running analysis and historical querying.

The device gateway (108) may include an issue code master reference (424). The issue code master reference (424) may be configured to store and serve issue codes and descriptions for all issue types reported, including the power outage issues.

The device gateway (108) may further include an email service (426) which may be configured to use pre-defined templates to transform data into formatted email messages. These messages may then delivered to users via an email sending service.

Figure 5:
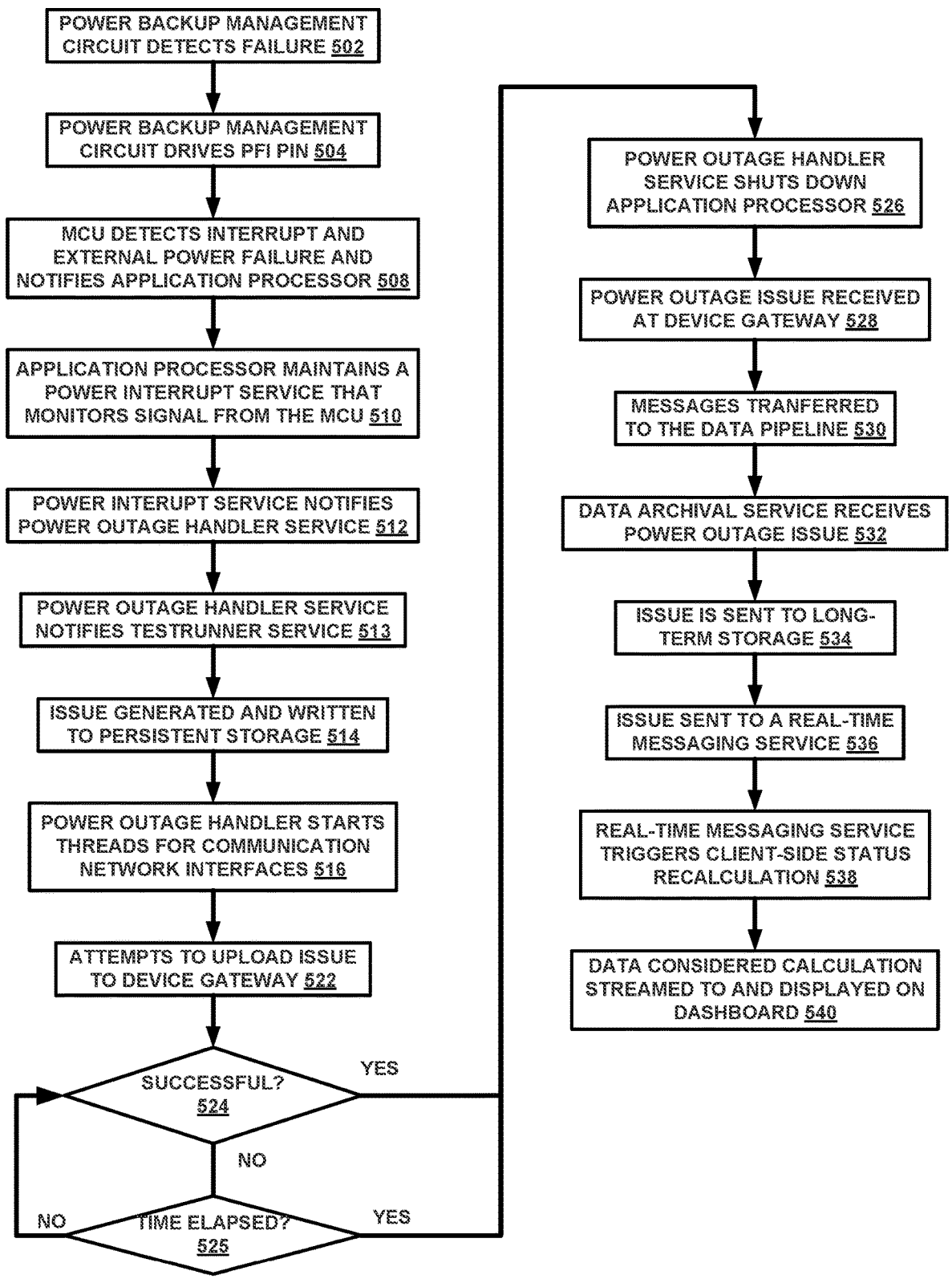
FIG. 5 is a flow diagram which illustrates an example power backup method.

The system (100) and communication network monitoring device (102) described in the foregoing may implement various methods relating to communication network monitoring. FIG. 5 is a flow diagram which illustrates an example power backup method (500). The power backup method (500) may find application in a broader communication network monitoring method.

Referring now collectively to FIG. 2 and FIG. 5, when an external power failure event occurs, e.g., meaning both PoE input and the DC input are not delivering sufficient voltage to the communication network monitoring device (102), the power backup integrated supercapacitor management circuit (214B) may detect (502) the failure and drive (504) the Power Fail Indicator (PH) pin on the MCU (216). This may indicate a loss of external power and may effect a seamless switch over to the power backup system.

Driving the PFI pin causes an interrupt on the MCU (216). The MCU (216) interprets this as an external power failure and notifies (508) the application processor (218) by means of a GPIO pin that connects the MCU (216) to the application processor (218). This GPIO pin may be kept in this state as long as the power failure event is ongoing.

The application processor (218) maintains a power interrupt service that constantly monitors (510) the GPIO signal from the MCU (216), and acts similarly to the interrupt routine used by the MCU firmware. The power interrupt service notifies (512) a power outage handler service in the main device software by Unix signal. The power outage handler service may notify (513) the testrunner service to stop testing and go, into the power fail state. An issue may then be generated (514) and written to persistent storage (not shown).

Upon detecting a power fail state, the sensor may run a series of network and environmental checks to ascertain the state of the network during the power outage event.

An issue is then generated and written to persistent storage, including any results from the network and environmental checks. After the power outage issue has been generated, the power outage handler service may start (516) threads for each, communication network interface (e.g., Ethernet, WI-FI™, Cellular) which communicate with each respective interface control process. Each thread attempts connect the interface to the internet if it is not already connected.

If a particular interface (106), shown in FIG. 1, is known to be unable to establish a connection, it may be powered down with the use of a load switch (220). This may conserve power backup, extending the runtime in backup state.

Once connected to the internet and able to access the device gateway cloud service, each thread may attempt to upload (522) the issue to the device gateway (108). If the issue is not successfully uploaded and time has not elapsed, the thread(s) will continue (525) to try to upload the issue (522) to the device gateway (108). Once time has elapsed (525) or the issue is successfully uploaded (524) on any interface or if a specific amount of time has passed, the power outage handler service will shut down (526) the application processor (218) gracefully. This specific time is the maximum amount of time that the power backup system is able to keep all systems running for, plus the amount of time it takes to shut down the application processor (218).

When a power outage issue is received (528) on the device gateway (108) from the communication network monitoring device (102), the message may first be authenticated to ensure that communication is from the communication network monitoring device (102) it claims to be from. Messages that fail authentication are discarded and no further processing occurs. Successfully authenticated messages are transferred (530) to the data pipeline for processing by relevant backend systems (110). There are two systems that are relevant in the case of a power outage issue: the data archival service, and the notification service. The pipeline will ensure delivery to both of these systems.

When the data archival service receives (532) a power outage issue from the communication network monitoring device (102), it is checked for validity. In order to be considered valid, the issue must be formatted correctly and must have all desired details, for example the start time of the power outage and the unique identifier of the communication network monitoring device (102) experiencing the power outage. Once validated, the issue is reformatted for long-term storage. After reformatting, the issue is sent (534) to long-term storage. Long term storage can later be queried for reporting and ad-hoc analysis.

While the issue is being processed by the data archival service, it may simultaneously be processed by the notification service. The relevant processing includes similar validity checks as in the data archival service.

Valid power outage issues may be saved to a database for future use by the notification service. Power outage issues may also be made available through the API gateway. When power outages are requested via the API gateway, the notification service is contacted and this database is queried for the issues in question. The issues are formatted to be amenable to consumption by other services before they are returned.

Additionally, the power outage issue is sent (536) to a real-time messaging service which may enable live updates on the dashboard. Users may configure mutes in order to quieten devices that experience too many issues. Issues that are not muted are potentially sent to the user via email or any third-party integrations, should the user have any configured.

The creation of the power outage issue in the real-time messaging service may trigger (538) a client-side status recalculation on the dashboard. This calculation takes into account a number of metrics and events in order to arrive at one of the following states: error, warning, good, offline, unconfigured. Each entity may have a state (entities being: devices, SSIDs, internal and external services), as well as aggregated groupings of these entities. All data considered in status calculations may be streamed (540) real-time to the dashboard. The data considered includes test metrics, issues, device online status and user-defined mutes.

Once the state of all affected entities has been recalculated it is displayed on the dashboard to the user. The user can request more detailed information about the issue, which is retrieved through the API gateway.

Figure 6:
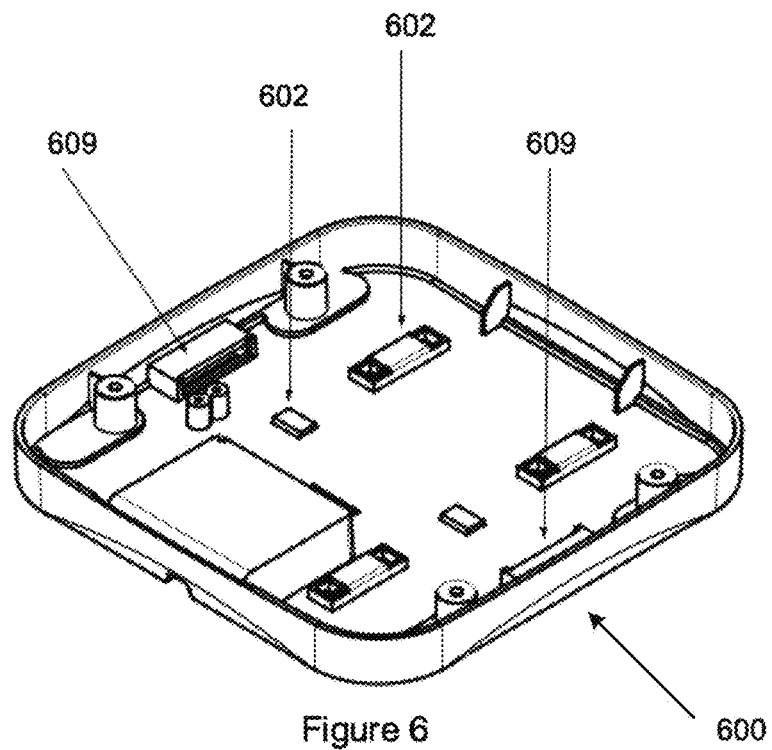
FIG. 6 is a three dimensional view of a mounting part of a housing of a device described herein.
Figure 7:
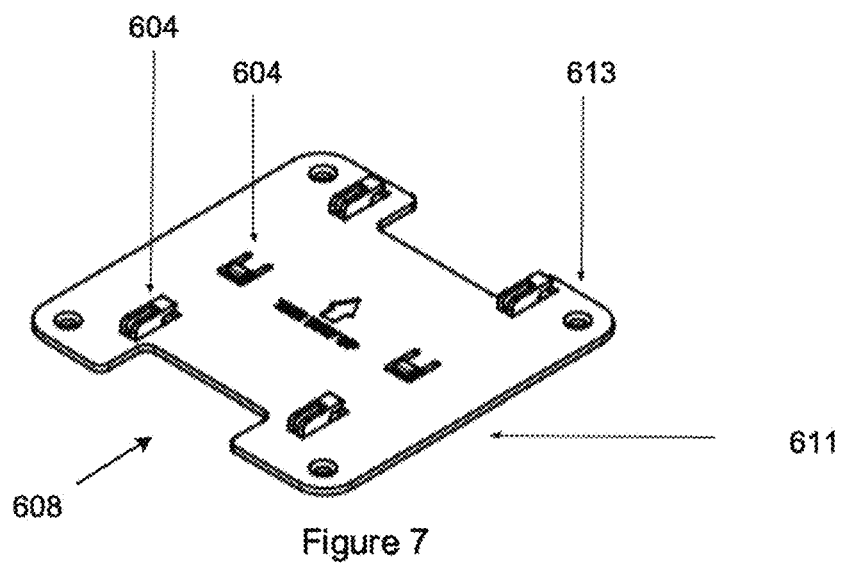
FIG. 7 is a three dimensional view of a mounting plate to which the mounting part of FIG. 6 connects.
Figure 8:
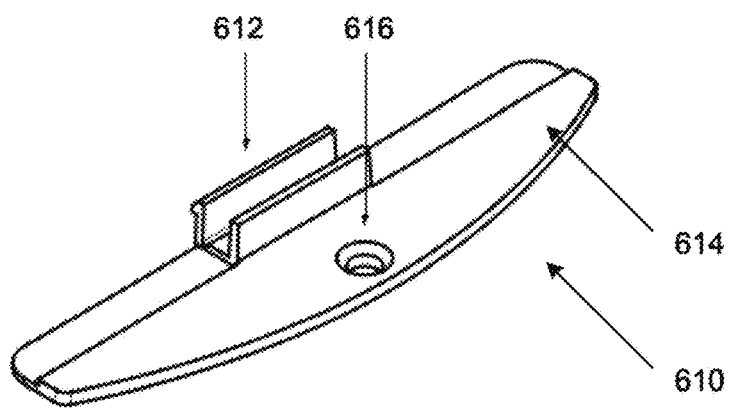
FIG. 8 is a three dimensional view of a security fin.

The communication network monitoring device (102) described herein may include a housing and mounting plate, aspects of which are illustrated in FIGS. 6 to 8. The housing includes a first, mounting part (600) and a second part which connects to the mounting part to close the housing. The mounting part (600) includes recesses (602) which are configured to receive cooperating hooks (604) of a mounting plate (608). The hooks and recesses are configured to provide a friction or interference fit so as to mount the housing to the mounting plate. The mounting part (600) may also include recesses (609) arranged to facilitate attachment of security fins.

The device mounting plate (608) may also include two adhesive strips (611—underside) which allow it to be fixed to a surface, as well as four screw holes (613) for more secure mounting.

Security fins (610) may also be provided. The security fins (610) are configured to clip into the back of the mounting part (600) and include hooks (612) arranged to cooperate with a recess of the mounting part. The fins (610) include a flange (614) which is arranged to extend beyond a profile of the housing when in use. The flanges provide a screw hole (616) each. When the housing is mounted to the mounting plate and the security fins are in place, screws can be used to secure the housing and prevent it from being unclipped from the mounting plate. Together with the mounting plate this may provide a level of security against theft and accidental removal of the device.

Figure 9:
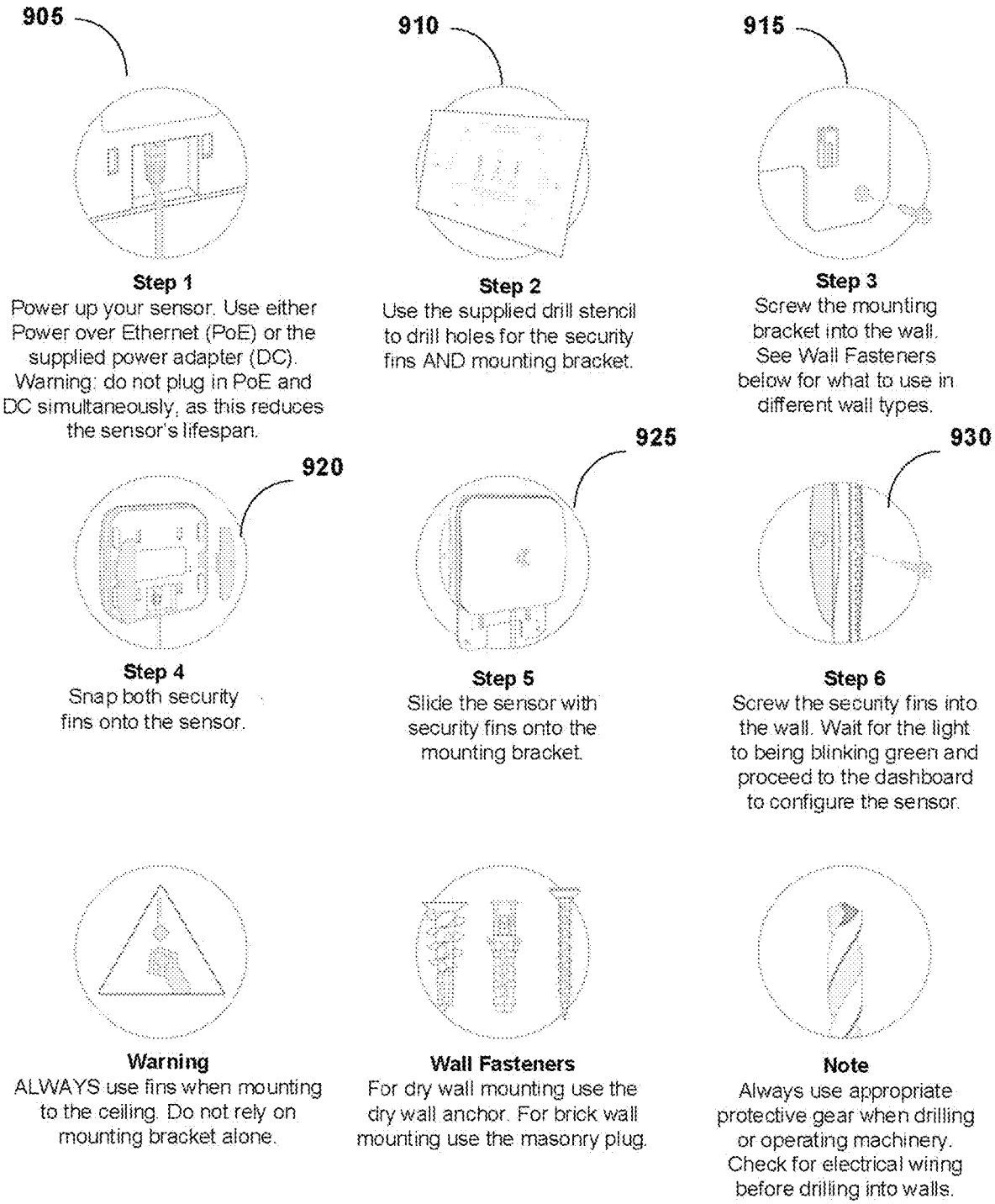
FIG. 9 is a diagram which illustrates fastening a device to a wall according to aspects of this disclosure.

FIG. 9 illustrates a method of installing the device and base plate according to aspects of the disclosure. The method begins with (at 905), powering up the sensor. Either the Power over Ethernet (PoE) or the supplied power adapter (DC) (not shown). The POE and the supplemental power adapter should not be plugged in simultaneously as that will reduce the sensor's lifespan. This is followed by (at 910) using the supplied drill stencil to drill holes for the security fins and the mounting bracket. The mounting bracket is screwed into the wall (at 915) using the appropriate wall fasteners. For dry wall mounting, dry wall anchors should be used. For brick wall mounting, masonry plugs should be used. The security fins are then snapped onto the sensor (at 920). This is followed by sliding (at 925) the sensor with the security fins onto the mounting bracket. The security fins are then screwed into the wall (at 930). Once the light begins blinking green, the sensor can then be configured from the dashboard.

The fins should always be used when mounting the sensor to the ceiling—the mounting bracket should not be relied upon alone. Also, appropriate protective gear should be worn while drilling or operating machinery. The walls should also be checked for electrical wiring prior to drilling.

Figure 10:
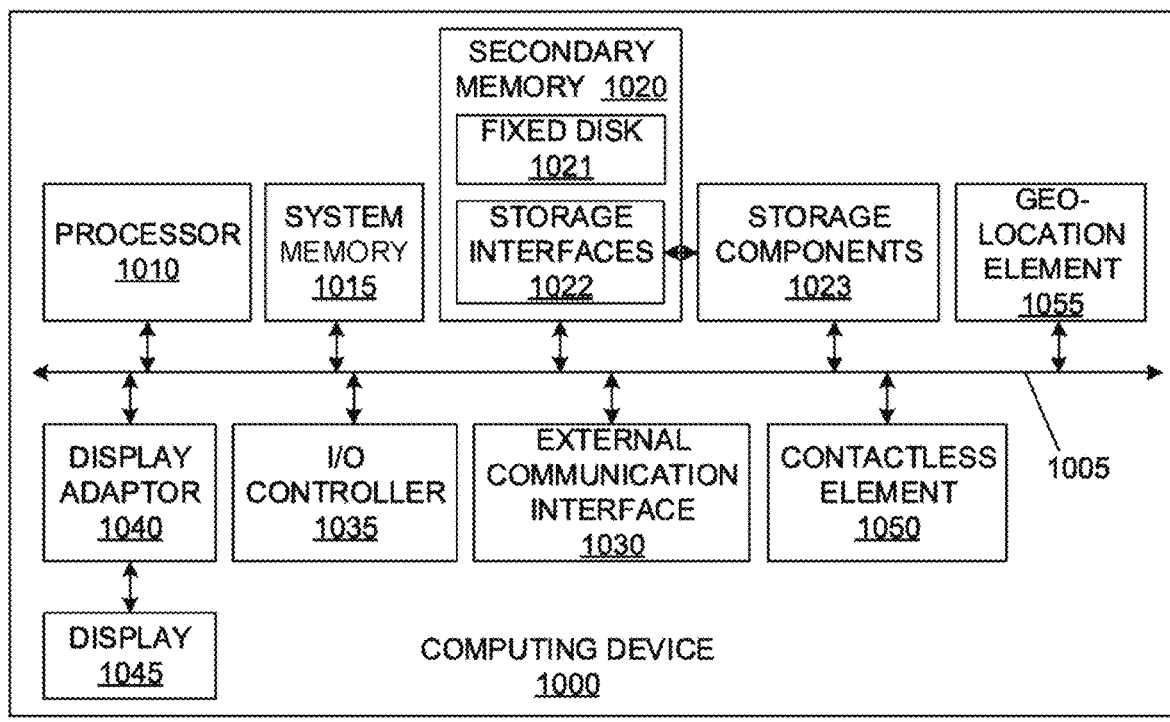
FIG. 10 illustrates an example of a computing device in which various aspects of the disclosure may be implemented.

FIG. 10 illustrates an example of a computing device (1000) in which various aspects of the disclosure may be implemented. The computing device (1000) may be embodied as any form of data processing device including a personal computing device (e.g., laptop or desktop computer), a server computer (which may be self-contained, physically distributed over a number of locations), a client computer, or a communication device, such as a mobile phone (e.g., cellular telephone), satellite phone, tablet computer, personal digital assistant or the like. Different embodiments of the computing device may dictate the inclusion or exclusion of various components or subsystems described below.

The computing device (1000) may be suitable for storing and executing computer program code. The various participants and elements in the previously described system diagrams may use any suitable number of subsystems or components of the computing device (1000) to facilitate the functions described herein. The computing device (1000) may include subsystems or components interconnected via a communication infrastructure (1005) (for example, a communications bus, a network, etc.). The computing device (1000) may include one or more processors (1010) and at least one memory component in the form of computer-readable media. The one or more processors (1010) may include one or more of: CPUs, graphical processing units (GPUs), microprocessors, field, programmable gate arrays (FPGAs), application specific integrated circuits (ASICs)

and the like. In some configurations, a number of processors may be provided and may be arranged to carry out calculations simultaneously. In some implementations various subsystems or components of the computing device (1000) may be distributed over a number of physical locations (e.g., in a distributed, cluster or cloud-based computing configuration) and, appropriate software units may be arranged to manage and/or process data on behalf of remote devices.

The memory components may include system memory (1015), which may include read only memory (ROM) and random access memory (RAM). A basic input/output system (BIOS) may be stored in ROM. System software may be stored in the system memory (1015) including operating system software. The memory components may also include secondary memory (1020). The secondary memory (1020) may include a fixed disk (1021), such as a hard disk drive, and, optionally, one or more storage interfaces (1022) for interfacing with storage components (1023), such as removable storage components (e.g., magnetic tape, optical disk, flash memory drive, external hard drive, removable memory chip, etc.), network attached storage components (e.g., NAS drives), remote storage components (e.g., cloud-based storage) or the like.

The computing device (1000) may include an external communications interface (1030) for operation of the computing device (1000) in a networked environment enabling transfer of data between multiple computing devices (1000) and/or the Internet. Data transferred via the external communications interface (1030) may be in the form of signals, which may be electronic, electromagnetic, optical, radio, or other types of signal. The external communications interface (1030) may enable communication of data between the computing device (1000) and other computing devices including servers and external storage facilities. Web services may be accessible by and/or from the computing device (1000) via the communications interface (1030).

The external communications interface (1030) may be configured for connection to wireless communication channels (e.g., a cellular telephone network, wireless local area network (e.g., using WI-FI), satellite-phone network, Satellite Internet Network, etc.) and may include an associated wireless transfer element, such as an antenna and associated circuity. The external communications interface (1030) may include a subscriber identity module (SIM) in the form of an integrated circuit that stores an international mobile subscriber identity and the related key used to identify and authenticate a subscriber using the computing device (1000). One or more subscriber identity modules may be removable from or embedded in the computing device (1000).

The external communications interface (1030) may further include a contactless element (1050), which is typically implemented in the form of a semiconductor chip (or other data storage element) with an associated wireless transfer element, such as an antenna. The contactless element (1050) may be associated with (e.g., embedded within) the computing device (1000) and data or control instructions transmitted via a cellular network may be applied to the contactless element (1050) by means of a contactless element interface (not shown). The contactless element interface may function to permit the exchange of data and/or control instructions between computing device circuitry (and hence the cellular network) and the contactless element (1050). The contactless element (1050) may be capable of transferring and receiving data using a near field communications capability (or near field communications medium) typically in accordance with a standardized protocol or data transfer mechanism (e.g., ISO 14443/NFC). Near field communications capability may include a short-range communications capability, such as radio-frequency identification (RFID), Bluetooth™, infra-red, or other data transfer capability that can be used to exchange data between the computing device (1000) and an interrogation device. Thus, the computing device (1000) may be capable of communicating and transferring data and/or control instructions via both a cellular network and near field communications capability.

The computer-readable media in the form of the various memory components may provide storage of computer-executable instructions, data structures, program modules, software units and other data. A computer program product may be provided by a computer-readable medium having stored computer-readable program code executable by the central processor (1010). A computer program product may be provided by a non-transient computer-readable medium, or may be provided via a signal or other transient means via the communications interface (1030).

Interconnection via the communication infrastructure (1005) allows the one or more processors (1010) to communicate with each subsystem or component and to control the execution of instructions from the memory components, as well as the exchange of information between subsystems or components. Peripherals (such as printers, scanners, cameras, or the like) and input/output (I/O) devices (such as a mouse, touchpad, keyboard, microphone, touch-sensitive display, input buttons, speakers and the like) may couple to or be integrally formed with the computing device (1000) either directly or via an I/O controller (1035). One or more displays (1045) (which may be touch-sensitive displays) may be coupled to or integrally formed with the computing device (1000) via a display (1045) or video adapter (1040).

The computing device (1000) may include a geographical location element (1055) which is arranged to determine the geographical location of the computing device (1000). The geographical location element (1055) may for example be implemented by way of a global positioning system (GPS), or similar, receiver module. In some implementations the geographical location element (1055) may implement an indoor positioning system, using for example communication channels such as cellular telephone or WI-FI™ networks and/or beacons (e.g., Bluetooth™ Low Energy (BLE) beacons, iBeacons™, etc.) to determine or approximate the geographical location of the computing device (1000). In some implementations, the geographical location element (1055) may implement inertial navigation to track and determine the geographical location of the communication device using an initial set point and inertial measurement data.

The foregoing description has been presented for the purpose of illustration; it is not intended to be exhaustive or to limit the invention to the precise forms disclosed. Persons skilled in the relevant art can appreciate that many modifications and variations are possible in light of the above disclosure.

Any of the steps, operations, components or processes described herein may be performed or implemented with one or more hardware or software units, alone or in combination with other devices. In one embodiment, a software unit is implemented with a computer program product comprising a non-transient computer-readable medium containing computer program code, which can be executed by a processor for performing any or all of the steps, operations, or processes described. Software units or functions described in this application may be implemented as computer program code using any suitable computer language such as, for example, Java™, C++, or Perl™ using, for example, conventional or object-oriented techniques. The computer program code may be stored as a series of instructions, or commands on a non-transitory computer-readable medium, such as a random access memory (RAM), a read-only memory (ROM), a magnetic medium such as a hard-drive, or an optical medium such as a CD-ROM. Any such computer-readable medium may also reside on or within a single computational apparatus, and may be present on or within different computational apparatuses within a system or network.

Flowchart illustrations and block diagrams of methods, systems, and computer program products according to embodiments are used herein. Each block of the flowchart illustrations and/or block diagrams, and combinations of blocks in the flowchart illustrations and/or block diagrams, may provide functions which may be implemented by computer readable program instructions. In some alternative implementations, the functions identified by the blocks may take place in a different order to that shown in the flowchart illustrations.

The language used in the specification has been principally selected for readability and instructional purposes, and it may not have been selected to delineate or circumscribe the inventive subject matter. It is therefore intended that the scope of the invention be limited not by this detailed description, but rather by any claims that issue on an application based hereon.

Accordingly, the disclosure of the embodiments of the invention is intended to be illustrative, but not limiting, of the scope of the invention, which is set forth in the following claims.

Finally, throughout the specification and claims unless the contents requires otherwise the word comprise' or variations such as 'comprises' or 'comprising' will be understood to imply the inclusion of a stated integer or group of integers but not the exclusion of any other integer or group of integers.

This concludes the detailed description. The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed is:

1. A power backup method for use in a communication network monitoring device, the method comprising:
   detecting an external power failure to the communication network monitoring device;
   in response to detecting the external power failure, driving a power fail indicator (PFI) pin of a supercapacitor-based power backup module internal to the communication network monitoring device, to cause an interrupt on a microcontroller unit (MCU) of the communication network monitoring device;
   in response to the interrupt on the MCU, switching to the supercapacitor-based power backup module for power; and
   while powered by the backup power source:
      generating an issue report recording the detected external power failure;
      communicating the issue report; and
      shutting down operation of the communication network monitoring device after communicating the issue report.

2. The method of claim 1, wherein communicating the issue report includes communicating the issue report to a backend notification service through a communication network and a device gateway.

3. The method of claim 1, further comprising notifying a user of the external power failure through a backend notification service.

4. The method of claim 1, further comprising, while powered by the supercapacitor-based power backup module:
   determining a set of network and environmental conditions; and
   writing the network and environmental conditions to a persistent storage.

5. The method of claim 4, further comprising, while powered by the supercapacitor-based power backup module:
   determining a set of network and environmental conditions; and
   communicating the network and environmental conditions to a data archival service and a notification service through a network interface and a device gateway.

6. The method of claim 1, further comprising, while powered by the supercapacitor-based power backup module:
   determining a set of network and environmental conditions; and
   communicating the network and environmental conditions to a data archival service and a notification service through a network interface and a device gateway.

7. A communication network monitoring device comprising:
   a supercapacitor-based power backup module;
   a processor including a microcontroller unit (MCU); and
   a memory component encoded with instructions that, when executed by the processor, cause the processor to:
      detect an external power failure to the communication network monitoring device;
      in response to detecting the external power failure, drive a power fail indicator (PFI) pin of the supercapacitor-based power backup module, to cause an interrupt on the MCU;
      in response to the interrupt on the MCU, switch to the supercapacitor-based power backup module for power a backup; and
      while powered by the supercapacitor-based power backup module:
         generate an issue report recording the detected external power failure;
         communicate the issue report; and
         shut down operation of the communication network monitoring device after communicating the issue report.

8. The communication network monitoring device of claim 7, wherein communicating the issue report includes communicating the issue report to a backend notification service through a communication network and a device gateway.

9. The communication network monitoring device of claim 7, wherein the encoded instructions, when executed by the processor, cause the processor to, while powered by the supercapacitor-based power backup module, notify a user of the external power failure through a backend notification service.

10. The communication network monitoring device of claim 7, wherein the encoded instructions, when executed by the processor, cause the processor to, while powered by the supercapacitor-based power backup module:
  determine a set of network and environmental conditions; and
  write the network and environmental conditions to a persistent storage.

11. The communication network monitoring device of claim 10, wherein the encoded instructions, when executed by the processor, cause the processor to, while powered by the supercapacitor-based power backup module:
  determine a set of network and environmental conditions; and
  communicate the network and environmental conditions to a data archival service and a notification service through a network interface and a device gateway.

12. The communication network monitoring device of claim 7, wherein the encoded instructions, when executed by the processor, cause the processor to, while powered by the supercapacitor-based power backup module:
  determine a set of network and environmental conditions; and
  communicate the network and environmental conditions to a data archival service and a notification service through a network interface and a device gateway.

13. The communication network monitoring device of claim 7, wherein the supercapacitor-based power backup module comprises a supercapacitor bulk energy storage bank and an integrated supercapacitor management circuit.

14. The communication network monitoring device of claim 13, wherein the integrated supercapacitor management circuit is configured to charge supercapacitors at a constant rate by dropping an input voltage using a built-in voltage regulator.

15. The communication network monitoring device of claim 13, wherein the integrated supercapacitor management circuit is configured to monitor a health of supercapacitors.

16. The communication network monitoring device of claim 13, further comprising:
  an external power input component to receive electrical power from one or more external power sources, wherein the integrated supercapacitor management circuit is configured to detect a drop in input voltage of the external power input component and use the supercapacitor bulk energy storage bank to provide stored energy.

17. The communication network management device of claim 13, wherein the integrated supercapacitor management circuit is configured to boost a voltage from the supercapacitor bulk energy storage bank when the voltage decreases below a minimum programmed backup voltage.

18. A power backup method for use in a communication network monitoring device, the method comprising:
  detecting an external power failure to the communication network monitoring device;
  in response to detecting the external power failure, driving a power fail indicator (PFI) pin of a supercapacitor-based power backup module internal to the communication network monitoring device, to cause an interrupt on a microcontroller unit (MCU) of the communication network monitoring device;
  in response to the interrupt on the MCU, switching to the supercapacitor-based power backup module for power;
  operating on power from the supercapacitor-based power backup module; and
  while operating on power from the supercapacitor-based power backup module:
    recording the occurrence of the external power failure and a set of network and environmental conditions to a persistent storage upon detection of the external power failure;
    communicating a notice of the external power failure and the network and environmental conditions to a data archival service and a notification service through a network interface and a device gateway;
    archiving the communicated notice and network and environmental conditions for long term storage through the data archival service;
    notifying a user through the notification service by displaying the communicated notice and network and environmental conditions on a user dashboard; and
    shutting down operation of the communication network monitoring device after communicating the notice and notifying the user.

19. A system, comprising:
a plurality of communication networks;
a plurality of backend systems including:
a notification service that, in operation, notifies a user of received network and environmental conditions by displaying the received network and environmental conditions on a user dashboard; and
a data archival service that, in operation, archives received network and environmental conditions for long term storage;
a device gateway through which the communications networks interact with the backend systems; and
a communication network monitoring device in communication with the backend systems through the communication networks and the device gateway, the communications network monitoring device including:
  a supercapacitor-based power backup module;
  a processor including a microprocessor unit (MCU); and
  a memory component encoded with instructions that, when executed by the processor, cause the processor to:
    detect an external power failure;
    in response to detecting the external power failure, drive a power fail indicator (PFI) pin of the supercapacitor-based power backup module, to cause an interrupt on the MCU;
    in response to the interrupt on the MCU, switch to the supercapacitor-based power backup module for power;
    operate on power from the supercapacitor-based power backup module; and
    while operating on power from the supercapacitor-based power backup module:
      record the occurrence of the external power failure and a set of network and environmental conditions to a persistent storage upon detection of the external power failure;
      communicate the network and environmental conditions to the data archival service for recordation and the notification service through the communication networks and the device gateway; and
      shutting down operation of the communication network monitoring device.

* * * * *